(12) United States Patent
Lepere et al.

(10) Patent No.: US 8,245,171 B2
(45) Date of Patent: Aug. 14, 2012

(54) METHODS, SYSTEMS, AND COMPUTER PROGRAM PRODUCT FOR IMPLEMENTING INTERACTIVE CROSS-DOMAIN PACKAGE DRIVEN I/O PLANNING AND PLACEMENT OPTIMIZATION

(75) Inventors: Jean-Francois Lepere, Le Versoud (FR); Janez Jaklic, Munich (DE)

(73) Assignee: Cadence Design Systems, Inc., San Jose, CA (US)

( * ) Notice: Subject to any disclaimer, the term of this patent is extended or adjusted under 35 U.S.C. 154(b) by 516 days.

(21) Appl. No.: 12/414,261

(22) Filed: Mar. 30, 2009

(65) Prior Publication Data

US 2010/0125822 A1 May 20, 2010

Related U.S. Application Data

(60) Provisional application No. 61/115,054, filed on Nov. 15, 2008.

(51) Int. Cl.
*G06F 17/50* (2006.01)

(52) U.S. Cl. ......... 716/119; 716/104; 716/126; 716/132

(58) Field of Classification Search .................. 716/104, 716/119, 126, 132
See application file for complete search history.

(56) References Cited

U.S. PATENT DOCUMENTS 7,823,113 B1 * 10/2010 Waller et al. .................. 716/129

* cited by examiner

*Primary Examiner* — Thuan Do

(74) *Attorney, Agent, or Firm* — Vista IP Law Group, LLP

(57) ABSTRACT

Disclosed are a method, a system, and a computer program product for implementing interactive cross-domain package driven I/O planning and placement optimization of an electronic circuit design. In some embodiments, the method identifies an object on a first EDA tool session, determines a drop location for the first object based on a tentative location in the first EDA tool session, places the first object at the drop location, and adjusts the drop location via a second EDA tool session, performs placement or routing of a portion of the design. The method or the system further comprises placing a corresponding first object in the second EDA tool session, initiating the second EDA tool session object move in the first EDA tool session, determining whether a constraint is satisfied.

43 Claims, 9 Drawing Sheets

METHODS, SYSTEMS, AND COMPUTER PROGRAM PRODUCT FOR IMPLEMENTING INTERACTIVE CROSS-DOMAIN PACKAGE DRIVEN I/O PLANNING AND PLACEMENT OPTIMIZATION

CROSS-REFERENCE TO RELATED APPLICATIONS

The present application claims the benefit of U.S. Provisional Application No. 61/115,054, filed on Nov. 15, 2008, which is hereby incorporated by reference in its entirety.

BACKGROUND

The invention relates to technologies and techniques for integrated circuit ("IC") design.

A semiconductor integrated circuit (IC) has a large number of electronic components, such as transistors, logic gates, diodes, wires, etc., that are fabricated by forming layers of different materials and of different geometric shapes on various regions of a silicon wafer. The design of an integrated circuit transforms a circuit description into a geometric description called a layout. The process of converting specifications of an integrated circuit into a layout is called the physical design. After the layout is complete, it is then checked to ensure that it meets the design requirements. The result is a set of design files, which are then converted into pattern generator files. The pattern generator files are used to produce patterns called masks by an optical or electron beam pattern generator. Subsequently, during fabrication of the IC, these masks are used to pattern chips on the silicon wafer using a sequence of photolithographic steps. Electronic components of the IC are therefore formed on the wafer in accordance with the patterns.

Many phases of physical design may be performed with computer aided design (CAD) tools or electronic design automation (EDA) systems. To design an integrated circuit, a designer first creates high level behavior descriptions of the IC device using a high level hardware design language. An EDA system typically receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, their sizes and interconnections, for example.

An integrated circuit designer may use a set of layout EDA application programs to create a physical integrated circuit design layout from a logical circuit design. The layout EDA application uses geometric shapes of different materials to create the various electrical components on an integrated circuit and to represent electronic and circuit IC components as geometric objects with varying shapes and sizes.

After an integrated circuit designer has created an initial integrated circuit layout, the integrated circuit designer then tests and optimizes the integrated circuit layout using a set of EDA testing and analysis tools. Common testing and optimization steps include extraction, verification, and compaction. The steps of extraction and verification are performed to ensure that the integrated circuit layout will perform as desired. Extraction is the process of analyzing the geometric layout and material composition of an integrated circuit layout in order to "extract" the electrical characteristics of the designed integrated circuit layout. The step of verification uses the extracted electrical characteristics to analyze the circuit design using circuit analysis tools. Compaction is an example of a tool used to modify a layout in order to make it more suitable for manufacturing.

Designers often use a set of tools to design a chip from its RTL description to its layout implementation. Among these tools, one of the goals of the physical implementation tools is to optimize a chip up to its targeted functional frequency as specified by the designer while taking into account the physical data available from tools such as the placement and route tools. As electronic designs become larger, speeding up the physical implementation process runtime becomes a more important task.

Optimizing a design consists of modifying the database of the chip to meet the timing constraint specified by designers. The optimization engine identifies the most relevant timing paths to optimize and iterates over the instances along these timing paths. For each instance, it applies different actions to improve the slack on the critical path. Most usual known optimization actions are resizing, restructuring, buffering, and moving instances. These actions are normally computation intensive because the timing accuracy which relates to the timing graph, the RC extraction, routing estimation, etc. is usually required or mandatory.

Integrated circuit (IC) packaging or assembly is the final stage of semiconductor device fabrication in which the integrated circuit as manufactured on a piece of semiconductor material such as a wafer will be mounted and interconnected to various other components in or on a chip carrier which provides metal leads or pins protruding from the side(s) of the carrier to interface with other components on a, for example, printed circuit board. In the realm of IC packaging, the I/O placement in digital IC designs may have significant impact on routability and thus the cost of the final packaged IC. Moreover, the I/O placement may also have to conform to various constraints, requirements, conditions, or design rules (collectively design rules). As a result, it may be desirable or required to optimize the placement of I/O pads in both the context of the IC and the package to some degree.

Some modern electronic design automation (EDA) tools for physical implementation (collectively IC design tool) and package layout tools (collectively packaging tool) support some degree of data or model exchange between the packaging and IC design tool. Nonetheless, such an exchange of data or models often occurs through a database such as an Open Access (OA) database and some IC design tool I/O files. This exchange of data or models in known to be slow and often requires explicit actions by the users or designers. As a result, this exchange of data or models is often done in a batch-type optimization of I/O pad placement. What may further exacerbate the issue is that the optimization of I/O pad placement usually requires several time-consuming iterations between the IC design tool and the packaging tool. Usually, a circuit design may be required to work back and forth multiple times between the IC design tool and the packaging tool without knowing what impact there may be on one tool when the circuit designer initiates a change in or a move of a component in the other tool until the circuit designer uses the other tool to analyze the electronic circuit design.

Therefore, there exists a need for a method, system, and computer program product for implementing interactive cross-domain package driven I/O (input/output) planning and placement optimization.

SUMMARY

Disclosed are various embodiments of methods, systems, and computer program products for implementing interactive cross-domain package driven I/O planning and placement optimization.

In some embodiments, the method or the system for implementing interactive cross-domain package driven I/O planning and placement optimization comprises: identifying a first object on a first electronic design automation (EDA) tool session (EDATS); identifying a related object on a second EDATS; determining a drop location for the first object in the first EDATS based on a tentative location; placing, moving, translating, rotating, or mirroring (collectively placing) the first object in the first EDATS at the drop location; performing placement, routing, or moving of associated components based at least in part upon the drop location of the first object; adjusting the first object drop location in the first EDATS via the second EDATS; and adjusting a location of the related object in the first EDATS via the second EDATS.

In some embodiments, the method or the system for implementing interactive cross-domain package driven I/O planning and placement optimization comprises: identifying a first object on a second EDATS; placing the first object at a drop location based at least in part on a tentative location on a second EDATS; identifying a related object on the second EDATS; adjusting the drop location of the first object on the first EDATS; placing a corresponding first object and a corresponding related object in the first EDATS; and performing placement, routing, or moving of one or more associated components on the first EDATS based at least in part upon a result of placing a corresponding first object and a corresponding related object.

BRIEF DESCRIPTION OF THE FIGURES

The drawings illustrate the design and utility of preferred embodiments of the present invention. It should be noted that the figures are not drawn to scale and that elements of similar structures or functions are represented by like reference numerals throughout the figures. In order to better appreciate how the above-recited and other advantages and objects of the present inventions are obtained, a more particular description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Various embodiments of the invention which are directed to a method or the system for implementing interactive cross-domain package driven I/O planning and placement optimization. In various embodiments, the term "the method or the system" is used throughout this application and refers to one or more processes or acts of the method for implementing interactive cross-domain package driven I/O planning and placement optimization.

Figure 1:
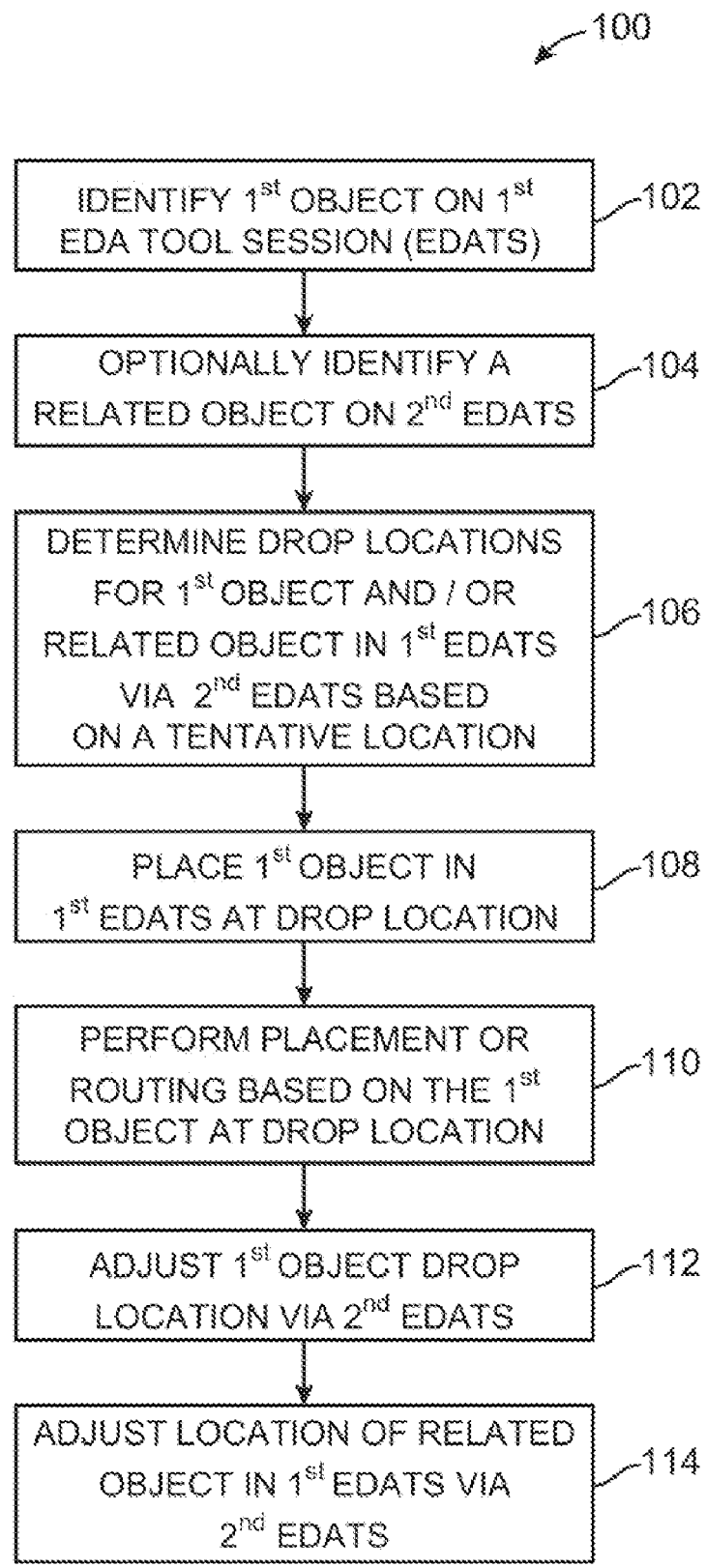
FIG. 1 illustrates a high level operational flow diagram for the method or the system for implementing interactive cross-domain package driven I/O planning and placement optimization.

Referring to FIG. 1 which illustrates a high level operational flow diagram for the method or the system for implementing interactive cross-domain package driven I/O planning and placement optimization. At 102, the method or the system for implementing interactive cross-domain package driven I/O planning and placement optimization identifies a first object on a first electronic design automation tool session (EDATS) in some embodiments. In some embodiments, the first object comprises an electronic circuit component of an electronic circuit design. The electronic circuit component comprises a pin of an IC or an I/O (input/output) cell of an IC. At 104, the method or the system for implementing interactive cross-domain package driven I/O planning and placement optimization may further optionally identify a related object on a second EDATS in some embodiments.

In some embodiments, a first EDATS refers to a session of an EDA tool initiated, invoked, or spawned (collectively initiate) on a first computing system, and the second EDATS refers to a second session of another EDA tool initiated on the first computing system or on a second computing system. In some embodiments, the first EDATS comprises a session for the first EDA tool which comprises a packaging layout tool which may be used to design, check, verify, validate, or manipulate the IC packaging design for the integrated circuit. In some embodiments, the first EDATS comprises a SiP (System in Package) tool. In some embodiments, the second EDATS comprises a session for the second EDA tool which comprises a physical electronic circuit design implementation tool which may be used to perform various activities for completing the electronic circuit design of the integrated circuit. In some embodiments, the physical electronic circuit design implementation tool comprises an I/O planner. In some embodiments, the initiation of the first EDATS or the second EDATS may also instantiate or cause to instantiate one or more database sessions. For example, the method or the system may instantiate a package layout database session when it initiates a first session for a SiP tool in some embodiments. The method or the system may also instantiate an IC layout database session when it initiates a second session for an electronic circuit physical implementation tool in some embodiments.

At 106, the method or the system for implementing interactive cross-domain package driven I/O planning and placement optimization determines the drop location for the first object in the first EDATS via a second EDATS in some embodiments. In some embodiments where the method or the system identify a related object on the second EDATS at 104, the method or the system may also optionally determine the drop location for the related object in the first EDATS via a second EDATS. In some embodiments, the method or the system makes such determinations based at least in part upon a tentative location. In some embodiments, a tentative location comprises a location that a designer or the EDA tool plans to place, move, rotate, translate, mirror, or a combination thereof (collectively place) the first object in the first EDATS.

For example, the method or the system may enable an electronic circuit designer to select the first object and attach the selected first object to, for example, a pointing device in some embodiments so the designer may move the first object around in the design. In these examples, the user may move the selected first object to a location that the designer intends to place the selected first object. The location that the designer intends to place the selected first object may be precisely defined or may be loosely selected based on, for example, the location shown on the display. The electronic circuit designer may then execute a command to place the selected first object in the first EDATS at the tentative location. In some of these embodiments, the method or the system for implementing interactive cross-domain package driven I/O planning and placement optimization shows a ghost image of the first object that is attached to, for example, the pointing device to enable the electronic circuit designer to visualize what the design will look like with the first object. In some embodiments, the ghost image of the first object comprises a detailed image of all or some components of the first object. In other embodiments, the ghost image of the first object comprises a simplified image of the first object.

In some embodiments, the drop location is determined by taking into account various constraints, design rules, requirements, or conditions (collectively constraints) as well as the tentative location selected or chosen by the electronic circuit designer. In some embodiments, the determination of the drop location may be performed by the second EDATS. In other embodiments, the determination of the drop location may be performed by the first EDATS or by another EDATS which is capable of checking the various constraints and determining such a drop position. In some embodiments, the determination of the drop location comprises a process or a module for legalization.

At 108, the method or the system for implementing interactive cross-domain package driven I/O planning and placement optimization places the first object in the first EDATS at the drop location in some embodiments. At 110, the method or the system for implementing interactive cross-domain package driven I/O planning and placement optimization performs placement, which collectively represents placement, translation, rotation, or mirroring, or routing for the first object or the electronic circuit design comprising the first object in the first EDATS based at least in part on the placement of the first object at the drop location in some embodiments. For example, in some embodiments where the first object comprises a pin of an IC package design, the method or the system may perform package routing and wire-bonding based at least in part upon the placement of the pin at the drop location.

At 112, the method or the system for implementing interactive cross-domain package driven I/O planning and placement optimization adjusts the drop location of the first object via the second EDATS in some embodiments. In some embodiments, the method or the system adjusts the drop location of the first object using an I/O planner or an electronic design physical implementation tool. In some embodiments, the method or the system adjusts the drop location of the first location by using logic such as a fuzzy logic or other multi-valued logic. In some embodiments, the method or the system utilizes the fuzzy logic for reasoning based upon a tentative location to determine a degree of truth and a possibility for a candidate of the drop location. In some embodiments where the method or the system utilizes the fuzzy logic to adjust or determine the drop location, the method or the system also takes various constraints into account in the form of input and/or the reasoning rules. In some other embodiments, the method or the system utilizes one or more empirical or precise mathematical formulae which comprise one or more rule-based or model-based empirical or precise mathematical formulae to determine or adjust the drop location.

At 114, the method or the system for implementing interactive cross-domain package driven I/O planning and placement optimization adjusts or places (collectively adjust) one or more locations of other objects which are related to or affected by the first object in the first EDATS by using the second EDATS in some embodiments. For example, in some embodiments where the first object comprises a pin of an IC package design, the method or the system may adjust one or more locations of other pins, one or more I/O cells, pads, or other electronic circuit components in the IC package design that are affected by or related to the first object in the first EDATS which may comprise, for example, a SiP tool, by using a second EDATS which may comprise, for example, an I/O planner. A benefit of some embodiments is that the method or the system for implementing interactive cross-domain package driven I/O planning and placement optimization enables substantially concurrent or simultaneous moves of an object of an electronic circuit design in both the first and the second EDATSs. One of ordinary skills in the art will clearly understand that although a move in the first EDATS and another move in the second EDATS may be intended to be concurrent or simultaneous, there may still exist some lag due to the processing at, transmission of data or signals through, or accessing different resources at either or both of the first and the second EDATS, and that the two moves are thus considered substantially concurrent or substantially simultaneously.

In some embodiments, the method or the system may further identify, spawn, or initiate or may cause to spawn, identify, or initiate a plurality of slaves, a plurality of slave computing sessions, or a combination thereof (collectively slaves) on one or more computing systems for implementing interactive cross-domain package driven I/O planning and placement optimization in parallel. For example, the method or the system may spawn, initiate, or identify a plurality of slaves and identifies one of the plurality of slaves as the first EDATS and another of the plurality of slaves as the second EDATS to achieve at least some of the intended purposes in parallel in some embodiments.

In some embodiments, the method or the system may initiate, identify, or spawn a master computing or design session for implementing interactive cross-domain package driven I/O planning and placement optimization in parallel. For example, the method or the system may identify, spawn, or initiate a master computing or design session which comprises knowledge of part or all of the entire electronic design encompassing the objects of interest. In some embodiments, the method or the system identifies, determines, or replicates the part or all of the entire electronic design on each of the plurality of slaves. In some embodiments, the method or the system identifies, determines, or replicates a reduced representation of the part or all of the entire electronic design encompassing the objects of interest at one or more of the plurality of slaves. In these embodiments, the method or the system identifies, determines, or replicates the reduced representation to comprise just enough information for the slave to enable the slave to perform its various processes.

In some embodiments, the method or the system for implementing interactive cross-domain package driven I/O planning and placement optimization also comprises accessing one or more databases. A database may comprise a relational or non-relational database as is commonly understood in the art, a list, a table, or other data structures. In some embodiments, the method or the system for implementing interactive cross-domain package driven I/O planning and placement optimization also comprises embedding decision logic in the one or more databases. For example, the method or the system may embed decision logic for one or more constraints in the database, rather than in various binary or source codes. In these embodiments, the database may be queried to execute or perform the decision logic to determine whether or not the one or more constraints are satisfied.

In some embodiments, the method or the system may embed or modify the decision logic in the one or more databases dynamically while the electronic circuit design is being edited. That is, in some of these embodiments where the method or the system may embed or modify the decision logic dynamically, the method or the system may dynamically add or modify one or more constraints while the electronic circuit design is being edited. In these embodiments, various codes for the method or the system need not be modified to incorporate the changes in the one or more constraints or the addition of additional constraints.

In some embodiments, the method or the system for implementing interactive cross-domain package driven I/O planning and placement optimization enables or is configured to enable a plurality of users to concurrently perform various processes of the method or to concurrently invoke various modules to perform various processes. That is, in these embodiments, the method or the system for implementing interactive cross-domain package driven I/O planning and placement optimization supports concurrently editing the electronic circuit design by multiple users. In some embodiments, the method or the system may further comprise embedding decision logic in one or more databases as described in the preceding paragraphs immediately above.

In these embodiments, the method or the system may further comprise dynamically modifying one or more existing embedded decision logic or dynamically adding one or more additional decision logic in the one or more database to incorporate one or more changes in one or more constraints. In these embodiments that support concurrent editing of the electronic circuit design, the method or the system may further comprise broadcasting a change to the electronic circuit design to the users who are concurrently editing the design. An example of such a change to the electronic circuit design comprises a drop location of an object in some embodiments.

In some embodiments, the method or the system may accept the change based at least in part on a criterion. In some embodiments, the criterion comprises whether or not all the users who may be affected by the change accepts the change. In some embodiments, the method or the system may recommend to some or all users whether or not the change should be accepted based at least in part on a determination of whether there exist alternatives for the change. In some embodiments where the method or the system determines that there exist no alternative or that there do exist some alternatives for the change, but it may be desirable to implement the change, the method or the system may then recommend to the users who may be affected by the change that the change be accepted. In some embodiments where the change is determined to be accepted, the method or the system may then modify one or more existing constraints or add one or more additional constraints based at least in part upon the change accepted. In some embodiments, the method or the system may further propagate the one or more modified constraints or the one or more additional constraints, performs a check on these constraints, and notify one or more concurrent users of the results of the check.

Figure 2:
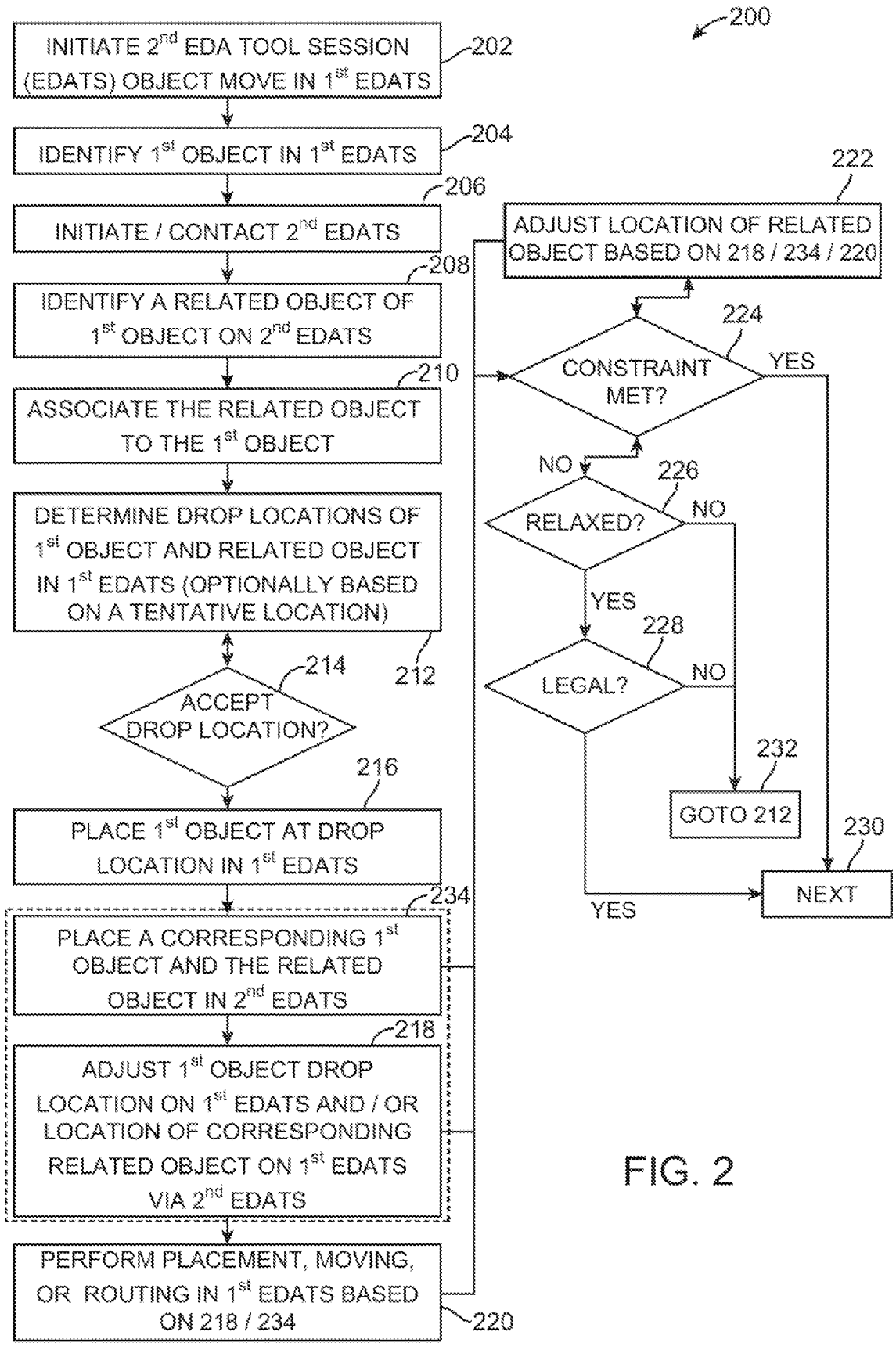
FIG. 2 illustrates more details for the method or the system for implementing interactive cross-domain package driven I/O planning and placement optimization as illustrated in FIG. 1.

Referring to FIG. 2 which illustrates more details for the method or the system for implementing interactive cross-domain package driven I/O planning and placement optimization as illustrated in FIG. 1.

At 202, the method or the system for implementing interactive cross-domain package driven I/O planning and placement optimization initiates a second EDATS object move in the first EDATS in some embodiments. In some of these embodiments, the method or the system may initiate the first EDATS and the second EDATS on the same computing system or on different computing systems. At 204, the method or the system for implementing interactive cross-domain package driven I/O planning and placement optimization identifies a first object in the first EDATS in some embodiments. At 206, the method or the system for implementing interactive cross-domain package driven I/O planning and placement optimization initiates or contacts a second EDATS in some embodiments. For example, the method or the system may identify a pin of an I/O cell in a SiP tool session at 204 and initiates or contacts an I/O planner tool session at 206 in some embodiments.

At 208, the method or the system for implementing interactive cross-domain package driven I/O planning and placement optimization may optionally identify a related object of the first object on the second EDATS in some embodiments. In some embodiments, the related object is related to, linked to, or affected by various processes performed or to be performed on the first object. For example, the method or the system may identify an I/O cell for a pin of a package layout on the second EDATS which comprises an I/O planner tool in some embodiments. In some embodiments, the second EDATS is used to identify the related object. In some embodiments, the method or the system may identify all such related objects.

At 210, the method or the system for implementing interactive cross-domain package driven I/O planning and placement optimization may optionally associate the related object to the first object and add both to a collection or a set of objects on the second EDATS in some embodiments. At 212, the method or the system for implementing interactive cross-domain package driven I/O planning and placement optimization determines a drop location for the first object in the first EDATS. In some embodiments where the method or the system identifies a related object of the first object on the second EDATS, the method or the system may also determine, at 212, a respective drop location of the related object in the first EDATS. In some embodiments, the method or the system may determine the drop location for the first object in the first EDATS based on a tentative location which is described in details in the preceding paragraphs. In some embodiments, the method or the system makes such a determination by using the second EDATS which comprises, for example, an electronic design physical implementation tool.

At 214, the method or the system for implementing interactive cross-domain package driven I/O planning and placement optimization determines whether or not the drop location determined at 212 is to be accepted in some embodiments. In some embodiments, the method or the system presents the drop location to the circuit designer or user and awaits the input from the designer or user to determine whether or not the drop location is to be accepted. In some embodiments where the method or the system determines that the drop location previously determined at 212 is not to be accepted, the method or the system goes back to determine another drop location for the first object based on the same consideration taken into account previously and the rejected drop location. In other embodiments where the method or the system determines to accept the drop location previously determined at 212, the method or the system proceeds to 216 to place the first object at the drop location in the first EDATS.

In some embodiments, the method or the system for implementing interactive cross-domain package driven I/O planning and placement optimization places a corresponding first object and the related object previously identified on the second EDATS at 234. For example, after the method or the system places the first object in the SiP tool at 216, the method or the system may place an object in the I/O planning tool which corresponds to the first object in the SiP tool and the related object in the I/O planning tool in the I/O planner in some embodiments. In some embodiments, the method or the system may also place, in the first EDATS, an object on the first EDATS which corresponds to the related object previously identified on the second EDATS.

At 218, the method or the system for implementing interactive cross-domain package driven I/O planning and placement optimization adjusts the first drop location of the first object on the first EDATS and/or the location of the object corresponding to the related object on the first EDATS via the second EDATS or by using the second EDATS in some embodiments. In some embodiments, the order in which 218 and 234 are performed is not critical and may be performed in any order as illustrated by the two-way arrow heads between 218 and 234 in FIG. 2.

At 220, the method or the system for implementing interactive cross-domain package driven I/O planning and placement optimization performs placement, routing, or moving, which collectively represents an act of translation, rotation, mirroring, or placing, in the first EDATS based at least in part upon a processing result of the process or module 218 and/or 234 in some embodiments.

At 222, the method or the system for implementing interactive cross-domain package driven I/O planning and placement optimization may optionally adjust the location of the related object in the first EDATS based at least in part upon one or more processing results of the process or modules at 218, 234, or 220 in some embodiments. In some embodiments, the method or the system may proceed from 234, 218, or 220 to 222 or to 224. At 224, the method or the system for implementing interactive cross-domain package driven I/O planning and placement optimization may further optionally determines whether or not one or more constraints, design rules, requirements, or conditions (collectively constraints) are satisfied in some embodiments. In some embodiments, the one or more constraints comprise that no overlap between cells or other components, that a cell is to remain with a bounding box of the chip, that whether an orientation of a pin is correct, or that whether a cell is aligned or attached to an edge of the cell. The above list is merely an example of what the one or more constraints may comprise and is not intended to be exhaustive. One of ordinary skills in the art will clearly understand that other types of constraints are definitely possible, and that the above list does not intend to limit the scope of various embodiments of the invention.

Figure 8:
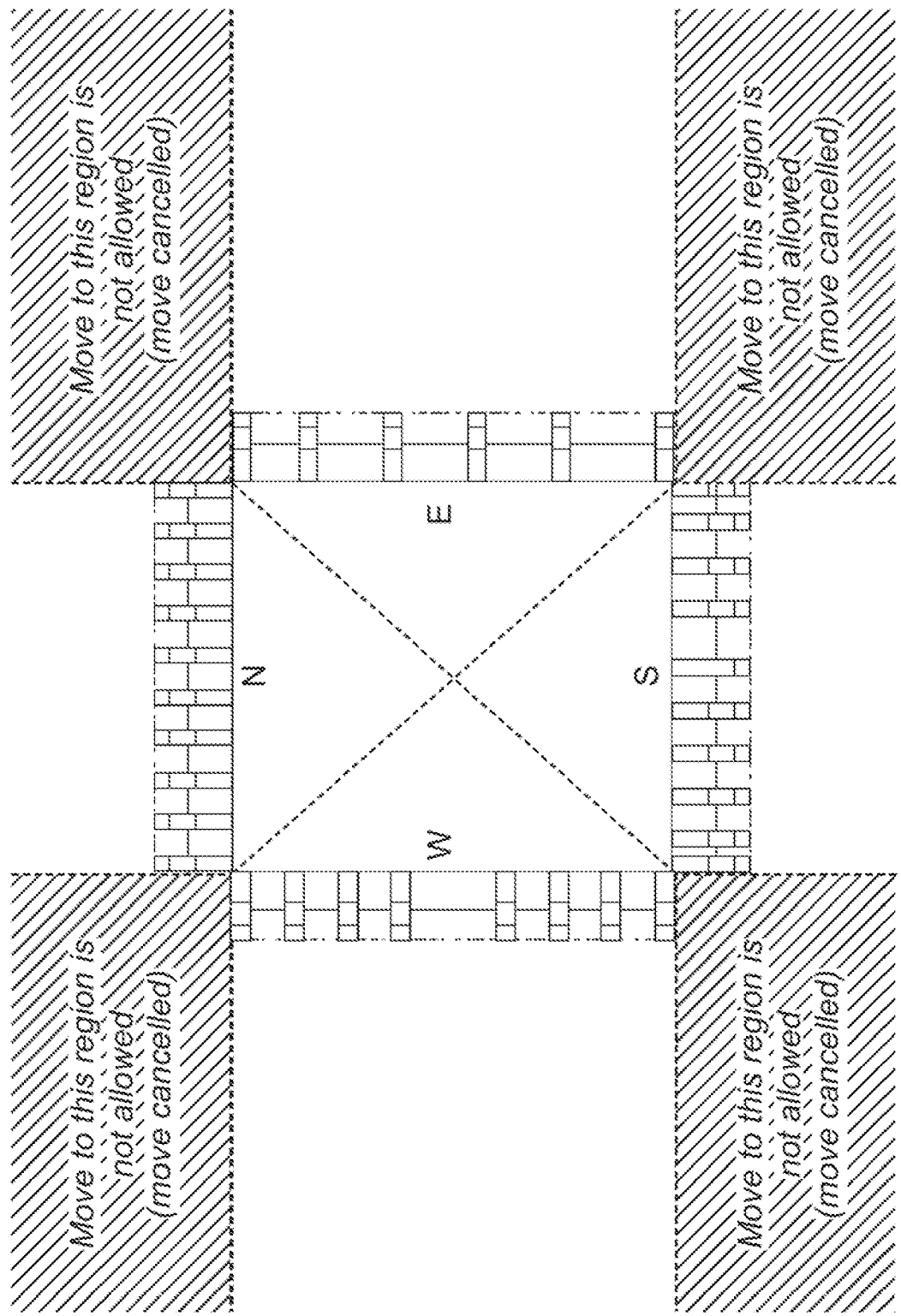
FIG. 8 illustrates an example of one or more constraints in some embodiments comprising wire bond bumps.

Referring to FIG. 8 which illustrates an example of one or more constraints in some embodiments comprising wire bond bumps for illustration and explanation purposes. In FIG. 8, the chip may be fictitiously divided into four quadrants— North (N), South (S), East (E), and West (W)—with artificial boundaries as shown in dashed lines in some embodiments. In these embodiments, the method or the system may automatically orient an object such as a pin, for example, in the right orientation either the tentative, drop, or an adjusted location, place the object at the correct or legal location also depending upon the quadrant the object is to be placed at.

For example, in some embodiments where a designer intends to place a pin in the north quadrant as indicated by the tentative location, the method or the system may automatically orient and places the pin at a correct location such as a location that is snapped to or connected to the edge of the central portion of the chip. In this example as shown in FIG. 8, the four shaded areas represent a design choice or a constraint that no objects are to be placed into these areas. Nonetheless, one of ordinary skills in the art will clearly understand that these shaded areas may be configured differently or may even be eliminated completely. For example, the method or the system may be configured in a way to extend the cross at the center of the chip while eliminating the shaded areas completely and orients and places all objects depending upon which quadrant the object is going to be placed. As another example, the method or the system may eliminate part or all of one or more shaded areas and divide the entire area accordingly. For example, the method or the system may be configured to eliminate shaded area in the upper right hand corner while extending part of the cross at the center into the upper right hand corner. Other configurations, modifications, or deviations are also possible and shall be considered within the scope of the embodiments as described above.

Referring back to FIG. 2. In some embodiments where the method or the system for implementing interactive cross-domain package driven I/O planning and placement optimization determines that the one or more constraints is satisfied at 224, the method or the system may proceed to 230 to continue the processing. In some embodiments where the method or the system determines at 224 that at least one constraint is not satisfied, the method or the system for implementing interactive cross-domain package driven I/O planning and placement optimization proceeds to 226 to optionally determine whether the constraint may be relaxed, ignored, overridden, or replaced (collectively relaxed) or whether the constraint constitute that falls within a don't-care space at 226.

In some embodiments where the method or the system for implementing interactive cross-domain package driven I/O planning and placement optimization determines at 226 that the constraint may be relaxed or fall with the don't-care space of constraints, the method or the system may further optionally determine whether the placement of the first object is legal at 228. In some embodiments, the same processes or modules may also apply to determine whether the placement of another object, such as the related object, is legal at 228. In some embodiments where the method or the system for implementing interactive cross-domain package driven I/O planning and placement optimization determines at 226 that the constraint may not be relaxed or may not fall within the don't-care space of constraints, the method or the system may proceed to 232 where the method or the system goes back to 212 to determine another drop location of the first object based on similar criteria as discussed in the preceding paragraphs and further on the illegal placement of the first object at the drop location previously determined.

In some embodiments where the method or the system determines at 228 that the placement of the first object is legal, the method or the system may proceed to 230 to continue further processing. In other embodiments where the method or the system determines at 228 that the placement of the first object is illegal, the method or the system may proceed to 232 where the method or the system goes back to 212 to determine another drop location of the first object based on similar criteria as discussed in the preceding paragraphs and further on the illegal placement of the first object at the drop location previously determined.

Figure 3:
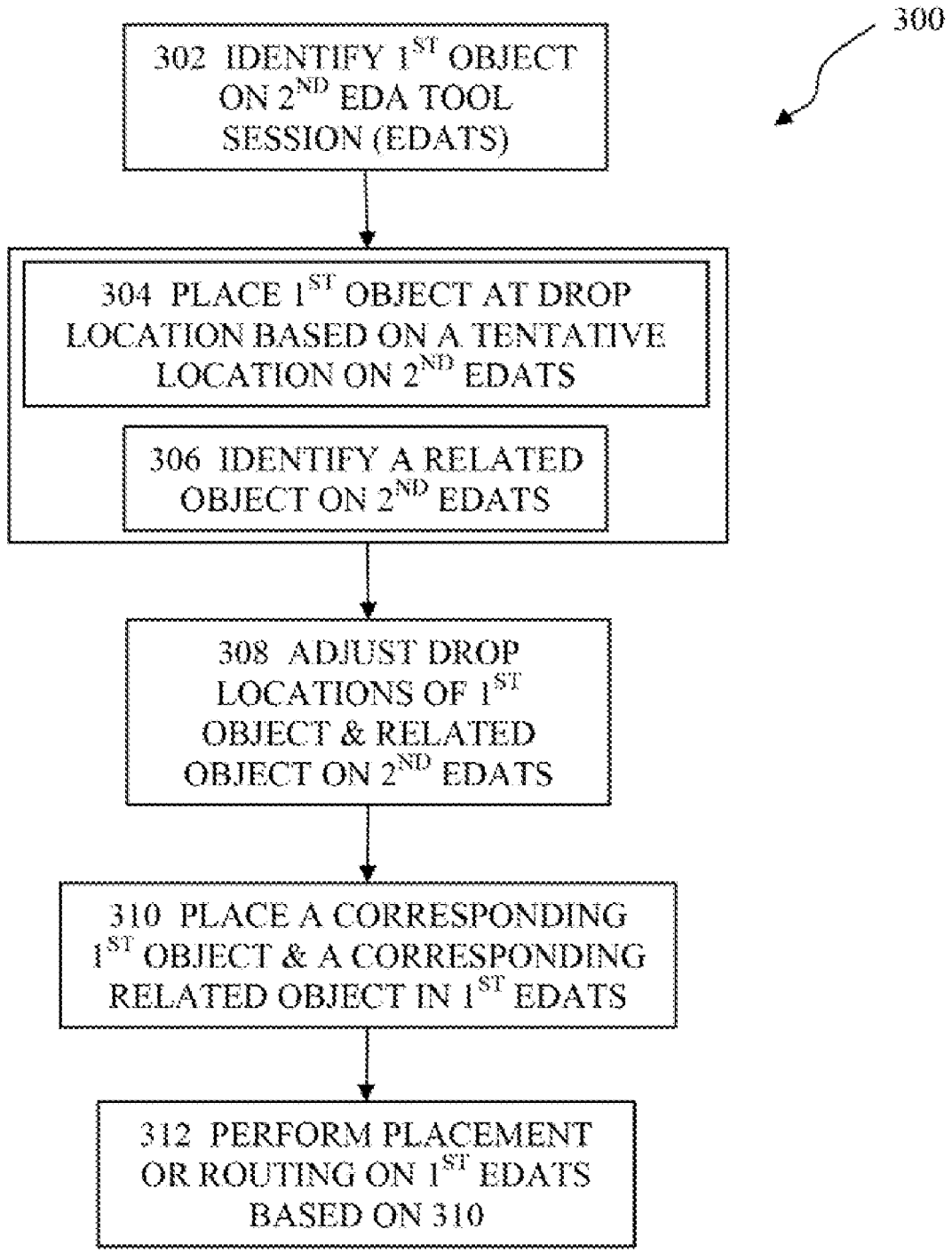
FIG. 3 illustrates another high level operational flow diagram for the method or the system for implementing interactive cross-domain package driven I/O planning and placement optimization.

Referring to FIG. 3 which illustrates another high level operational flow diagram for the method or the system for implementing interactive cross-domain package driven I/O planning and placement optimization. At 302, the method or the system for implementing interactive cross-domain package driven I/O planning and placement optimization identifies a first object on a second EDATS in some embodiments. In various embodiments, the second EDATS comprises the same as previously described in the detailed description for FIGS. 1 and 2.

At 304, the method or the system for implementing interactive cross-domain package driven I/O planning and placement optimization places the first object at a drop location on the second EDATS based at least in part upon a tentative location in some embodiments. For example, the method or the system may identify, in some embodiments, a pin or an I/O cell as the first object on an EDA physical implementation tool, such as an I/O planner, at 302 and places the pin or the I/O cell in the EDA physical implementation tool at 304. More details about the tentative location have been described in the preceding paragraphs and will not be repeated here. It shall be noted that the tentative location as referred to in 304 refers to a tentative location in the second EDATS as opposed to in the first EDATS as described previously in reference to FIGS. 1 and 2.

At 306, the method or the system for implementing interactive cross-domain package driven I/O planning and placement optimization identifies a related object using the second EDATS in some embodiments. In some embodiments, the method or the system may identify all the electronic circuit components which may be affected by or connected to the first object. For example, where a pin is identified and to be moved in some embodiments, it may be necessary or desirable to move the cell which comprises the pin together with the pin. In this example, the cell is thus deemed as a related object of the first object—the pin. As another example, there may be cases where other components such as other cells, although not directly connected to the first object of interest, may nonetheless be affected due to the placement of the first object due to issues such as insufficient real estate for placing the first object at the drop location or violation of one or more constraints. In the latter example, these other components are also deemed as the related objects. It shall be noted that the order in which 304 and 306 are performed is not critical to achieve various objects of various embodiments and does not intend to limit the scope of various embodiments of the invention. In some embodiments where the method or the system performs 306 before 304, the method or the system may place, at 304, the first object or the related object at the respective drop location on the second EDATS based at least in part upon the respective tentative locations.

At 308, the method or the system for implementing interactive cross-domain package driven I/O planning and placement optimization may optionally adjust the drop location of the second object or the related object on the second EDATS in some embodiments. In some embodiments, the method or the system adjusts the drop location of the first location by using logic such as a fuzzy logic or other multi-valued logic. In some embodiments, the method or the system utilizes the fuzzy logic for reasoning based upon a tentative location to determine a degree of truth and a possibility for a candidate of the drop location. In some embodiments where the method or the system utilizes the fuzzy logic to adjust or determine the drop location, the method or the system also takes various constraints into account in the form of input and/or the reasoning rules. In some other embodiments, the method or the system utilizes one or more empirical or precise mathematical formulae which comprise one or more rule-based or model-based empirical or precise mathematical formulae to determine or adjust the drop location.

At 310, the method or the system for implementing interactive cross-domain package driven I/O planning and placement optimization places a corresponding first object and a related object in the first EDATS based in some embodiments. For example, the method or the system may place a pin or an I/O cell together with one or more electronic circuit components in a SiP tool at 310 in some embodiments. At 312, the method or the system for implementing interactive cross-domain package driven I/O planning and placement optimization may perform placement or routing on the first EDATS based on the result of placing a corresponding first object and a corresponding related object in the first EDATS at 310 in some embodiments.

Figure 4:
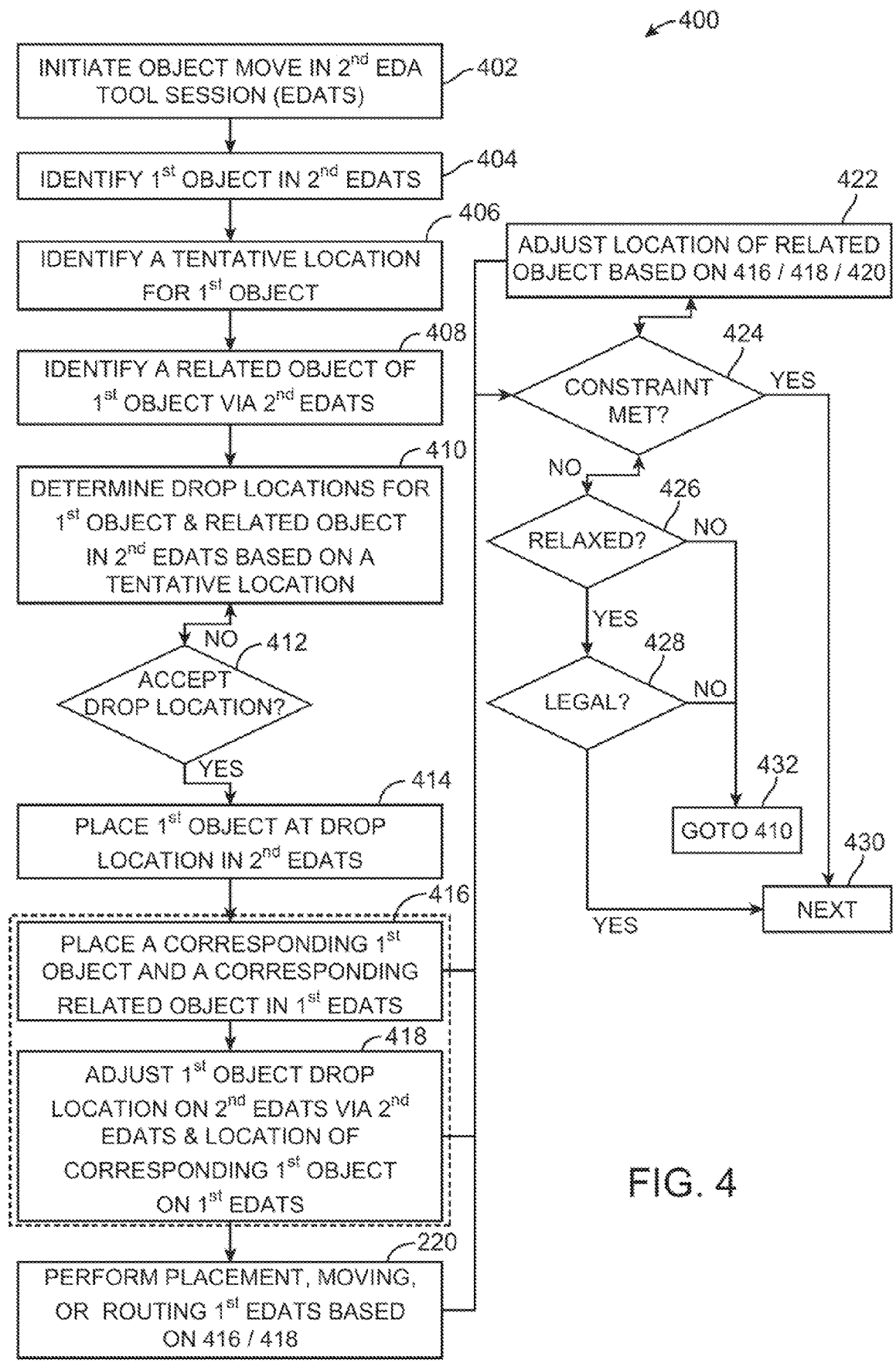
FIG. 4 illustrates more details for the method or the system for implementing interactive cross-domain package driven I/O planning and placement optimization as illustrated in FIG. 3.

Referring to FIG. 4 which illustrates more details for the method or the system for implementing interactive cross-domain package driven I/O planning and placement optimization as illustrated in FIG. 3.

At 402, the method or the system for implementing interactive cross-domain package driven I/O planning and placement optimization initiates object move in the second EDATS in some embodiments. For example, the method or the system may initiate object move in an EDA physical implementation tool in some embodiments. At 404, the method or the system for implementing interactive cross-domain package driven I/O planning and placement optimization identifies a first object in the second EDATS in some embodiments.

At 406, the method or the system identifies a tentative location for the first object on the second EDATS in some embodiments. At 408, the method or the system for implementing interactive cross-domain package driven I/O planning and placement optimization identifies a related object using the second EDATS of the first object by using the second EDATS in some embodiments. At 410, the method or the system determines a drop location in the second EDATS for the first object. It shall be noted that the tentative location referred here in reference to FIG. 4 is similar to that for FIGS. 1-2, and that the difference between the two tentative locations comprise the case where the tentative location in reference to FIGS. 1-2 refers to a tentative location in the first EDATS, where the tentative location in reference to FIGS. 3-4 refers to a tentative location in the second EDATS.

At 412, the method or the system for implementing interactive cross-domain package driven I/O planning and placement optimization may optionally determine whether or not the drop location previously determined at 412 is to be accepted in some embodiments. In some embodiments where the method or the system determines at 412 that the drop location previously determined is not to be accepted, the method or the system iteratively goes back to 410 to determine another drop location while taking similar factors or criteria together with the rejected drop location into account in some embodiments. In other embodiments where the method or the system determines that the drop location at 412 is to be accepted, the method or the system proceeds to 414 to place the first object at the drop location in the second EDATS.

At 416, the method or the system for implementing interactive cross-domain package driven I/O planning and placement optimization places, in some embodiments, a corresponding first object in the first EDATS which represents an object that corresponds to the first object in the second EDATS previously identified at 404 and a corresponding related object in the first EDATS which represents an object that corresponds to the related object in the second EDATS previously identified at 408.

At 418, the method or the system for implementing interactive cross-domain package driven I/O planning and placement optimization adjusts various locations on both the first and the second EDATSs by using the second EDATS in some embodiments. For example, the method or the system may, after placing in the first EDATS the objects corresponding to the first object and the related object, adjust the locations of these objects on the first EDATS by using the second EDATS. For example, the method or the system, after placing a pin and a related cell in the SiP tool, the method or the system may invoke or use the I/O planner or other physical implementation tools to adjust the locations of the pin and the cell in the SiP tool. In some embodiments, a communication channel is established for the method or the system to use or invoke the second EDATS to adjust the locations of one or more objects in the first EDATS. It shall be noted that the order in which 416 and 418 are performed is not critical to achieve various objects of various embodiments and does not intend to limit the scope of various embodiments of the invention.

At 420, the method or the system for implementing interactive cross-domain package driven I/O planning and placement optimization performs placement or routing in the first EDATS based on a result of 416 or 418 in some embodiments.

At 422, the method or the system for implementing interactive cross-domain package driven I/O planning and placement optimization may optionally adjust the location of the related object in the first EDATS based at least in part upon one or more processing results of the process or modules at 416, 418, or 420 in some embodiments. In some embodiments, the method or the system may proceed from 416, 418, or 420 to 422 or to 424. At 424, the method or the system for implementing interactive cross-domain package driven I/O planning and placement optimization may further optionally determine whether or not one or more constraints, design rules, requirements, or conditions (collectively constraints) are satisfied in some embodiments. In some embodiments, the one or more constraints comprise that no overlap between cells or other components, that a cell is to remain with a bounding box of the chip, that whether an orientation of a pin is correct, or that whether a cell is aligned or attached to an edge of the cell. The above list is merely an example of what the one or more constraints may comprise and is not intended to be exhaustive. One of ordinary skills in the art will clearly understand that other types of constraints are definitely possible, and that the above list does not intend to limit the scope of various embodiments of the invention.

In some embodiments where the method or the system for implementing interactive cross-domain package driven I/O planning and placement optimization determines that the one or more constraints is satisfied at 424, the method or the system may proceed to 430 to continue the processing. In some embodiments where the method or the system determines at 424 that at least one constraint is not satisfied, the method or the system for implementing interactive cross-domain package driven I/O planning and placement optimization proceeds to 426 to optionally determine whether the constraint may be relaxed, ignored, overridden, or replaced (collectively relaxed) or whether the constraint constitute that falls within a don't-care space.

In some embodiments where the method or the system for implementing interactive cross-domain package driven I/O planning and placement optimization determines at 426 that the constraint may be relaxed or fall with the don't-care space of constraints, the method or the system may further optionally determined whether the placement of the first object is legal at 428. In some embodiments, the same processes or modules may also apply to determine whether the placement of another object, such as the related object, is legal at 428. In some embodiments where the method or the system for implementing interactive cross-domain package driven I/O planning and placement optimization determines at 426 that the constraint may not be relaxed or may not fall within the don't-care space of constraints, the method or the system may proceed to 432 where the method or the system goes back to 410 to determine another drop location of the first object based on similar criteria as discussed in the preceding paragraphs and further on the illegal placement of the first object at the drop location previously determined.

In some embodiments where the method or the system determines at 428 that the placement of the first object is legal, the method or the system may proceed to 430 to continue further processing. In other embodiments where the method or the system determines at 428 that the placement of the first object is illegal, the method or the system may proceed to 432 where the method or the system goes back to 410 to determine another drop location of the first object based on similar criteria as discussed in the preceding paragraphs and further on the illegal placement of the first object at the drop location previously determined.

Figure 5A:
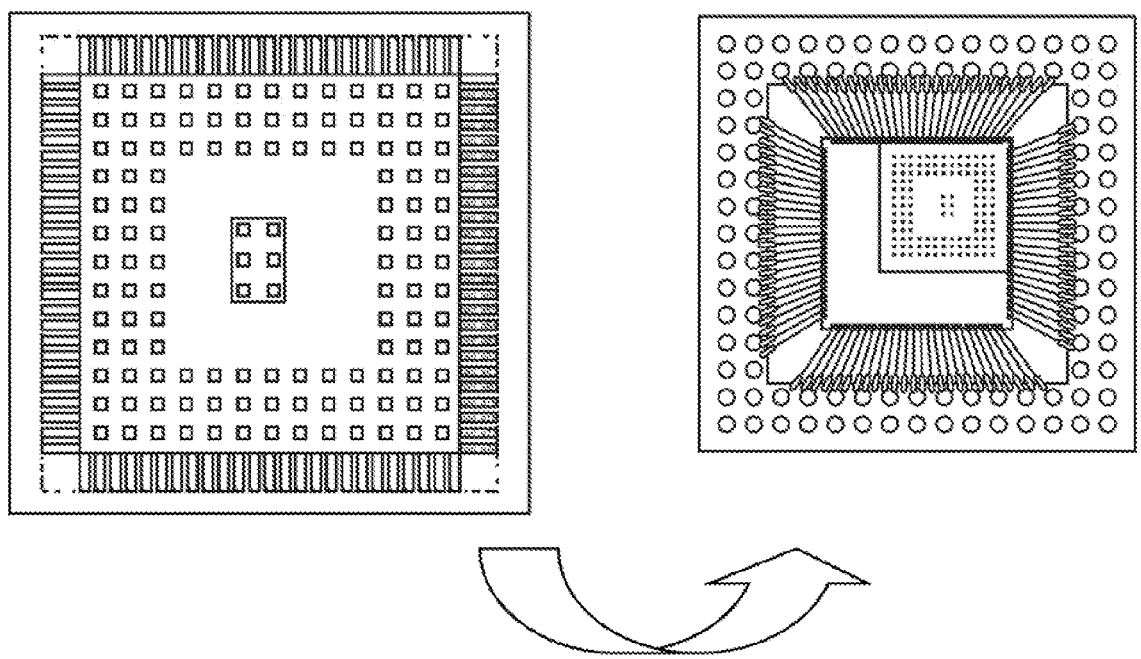
FIG. 5A illustrates an example of simultaneous object move in different electronic design automation tool sessions.

Referring to FIG. 5A which illustrates an example of simultaneous object move in different electronic design automation tool sessions. FIG. 5A shows a package layout in a packaging layout tool on the right hand side, an IC physical implementation tool on the left hand side. FIG. 5A also shows the placement of the chip in the physical implementation tool in the upper right hand corner in the form of an array of smaller dots in the display window of the packaging layout tool.

Figure 5B:
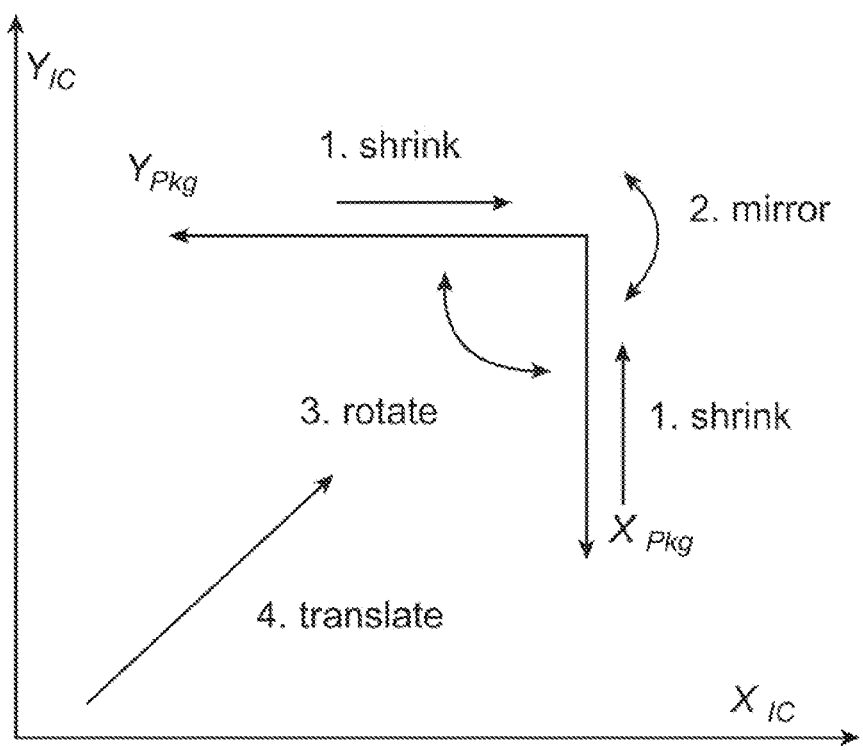
FIG. 5B illustrates the nomenclatures used for the simultaneous object move.

FIG. 5B illustrates the nomenclatures used for the simultaneous object move. As shown in the example as illustrated in FIG. 5B, the object move may comprise shrinking in size or in one dimension or scaling, mirroring about one axis, rotating, or translating. It shall be noted that other types of object move are also possible, and the above list of object moves is not exhaustive and does not intend to limit the scope of various embodiments of the invention. For example, there may exist some cases where a conformal mapping may be necessary or desirable. The conformal mapping techniques for transformation of geometrical attributes are known in mathematics and thus will not be repeated here.

In the example as illustrated in FIG. 5B, the method or the system may use the following transformation of geometric entities from the physical implementation tool to the packaging tool as set forth below.

$$\begin{bmatrix} X_{pkg} \\ Y_{pkg} \end{bmatrix} = \begin{bmatrix} \mu\sigma\cos\rho & -\sigma\sin\rho \\ \mu\sigma\sin\rho & \sigma\cos\rho \end{bmatrix} \begin{bmatrix} X_{IC} \\ Y_{IC} \end{bmatrix} + \begin{bmatrix} \tau_x \\ \tau_y \end{bmatrix},$$

where $X_{pkg}$ and $Y_{pkg}$ denote the geometric entities along the x- and y-axis respectively in the packaging tool session, $X_{IC}$ and $Y_{IC}$ denote the corresponding geometric entities along the x- and y-axis in the physical implementation tool, $\mu$ denotes mirroring, $\sigma$ denotes shrinking or scaling, $\rho$ denotes rotating, and $\tau_x$ and $\tau_y$ denote translation along the x- and y-axis respectively.

In the example as illustrated in FIG. 5B, the method or the system may use the following transformation of geometric entities from the physical implementation tool to the packaging tool as set forth below.

$$\begin{bmatrix} X_{IC} \\ Y_{IC} \end{bmatrix} = \begin{bmatrix} \mu\sigma\cos\rho & \mu\sigma\sin\rho \\ -\sigma\sin\rho & \sigma\cos\rho \end{bmatrix} \begin{bmatrix} X_{pkg} \\ Y_{pkg} \end{bmatrix} - \begin{bmatrix} \tau_x \\ \tau_y \end{bmatrix},$$

where $X_{pkg}$ and $Y_{pkg}$ denote the geometric entities along the x- and y-axis respectively in the packaging tool session, $X_{IC}$ and $Y_{IC}$ denote the corresponding geometric entities along the x- and y-axis in the physical implementation tool, $\mu$ denotes mirroring, $\sigma$ denotes shrinking or scaling, $\rho$ denotes rotating, and $\tau_x$ and $\tau_y$ denote translation along the x- and y-axis respectively.

Figure 6:
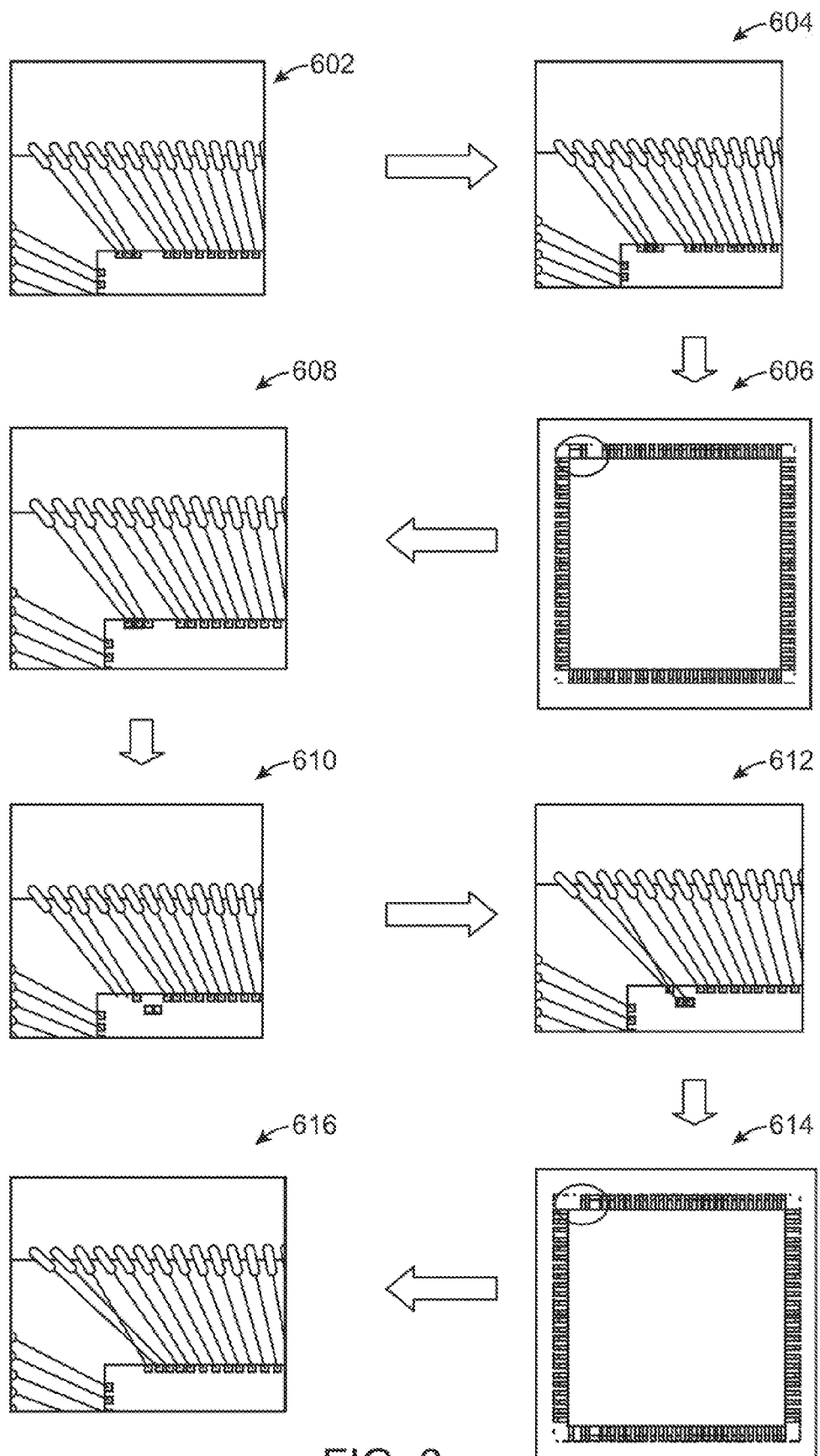
FIG. 6 illustrates an example of the operational flow of FIG. 2 in some embodiments.

Referring to FIG. 6 which illustrates an example of the operational flow of FIG. 2 in some embodiments where a SiP tool and an I/O planner are used for an IC packaging design. It shall be noted that FIG. 6 is presented here only for illustration and explanation purposes and does not intend to limit the scope of various embodiments to the SiP tool or the I/O planner described or shown here and does not intend to limit the scope of various embodiments to an IC packaging design as illustrated herein. One of ordinary skill in the art will clearly understand that although various illustrated embodiments as described in the specification use IC packaging design tool and IC physical implementation tool, the mentioning of these two tools is merely for illustration and explanation purposes and does not intend to limit the scope of various embodiments to these two types of EDA tools.

At 602, the method or the system invokes, in the SiP tool, a command for the I/O planner to move a pin. At 604, the method or the system identifies a pin in the SiP tool. At 606, the method or the system contacts the I/O planner to identify one or more related pins which are linked to the same I/O cell as the selected pin. At 608, the method or the system associate the pins linked to the same I/O cell as the selected pin to a selection in the SiP tool. At 610, the method or the system identifies and places the selected pin and/or the one or more related pins to new location(s). At 612, the method or the system places the selected pin or the one or more related pins at the drop location(s). The method or the system may further adjust package routing and bonds accordingly. At 614, the method or the system contacts the I/O planner to adjust the location of an I/O cell to conform to one or more constraints. At 616, the method or the system adjusts the location of package pin according to the adjustment previously performed at 614.

Figure 7:
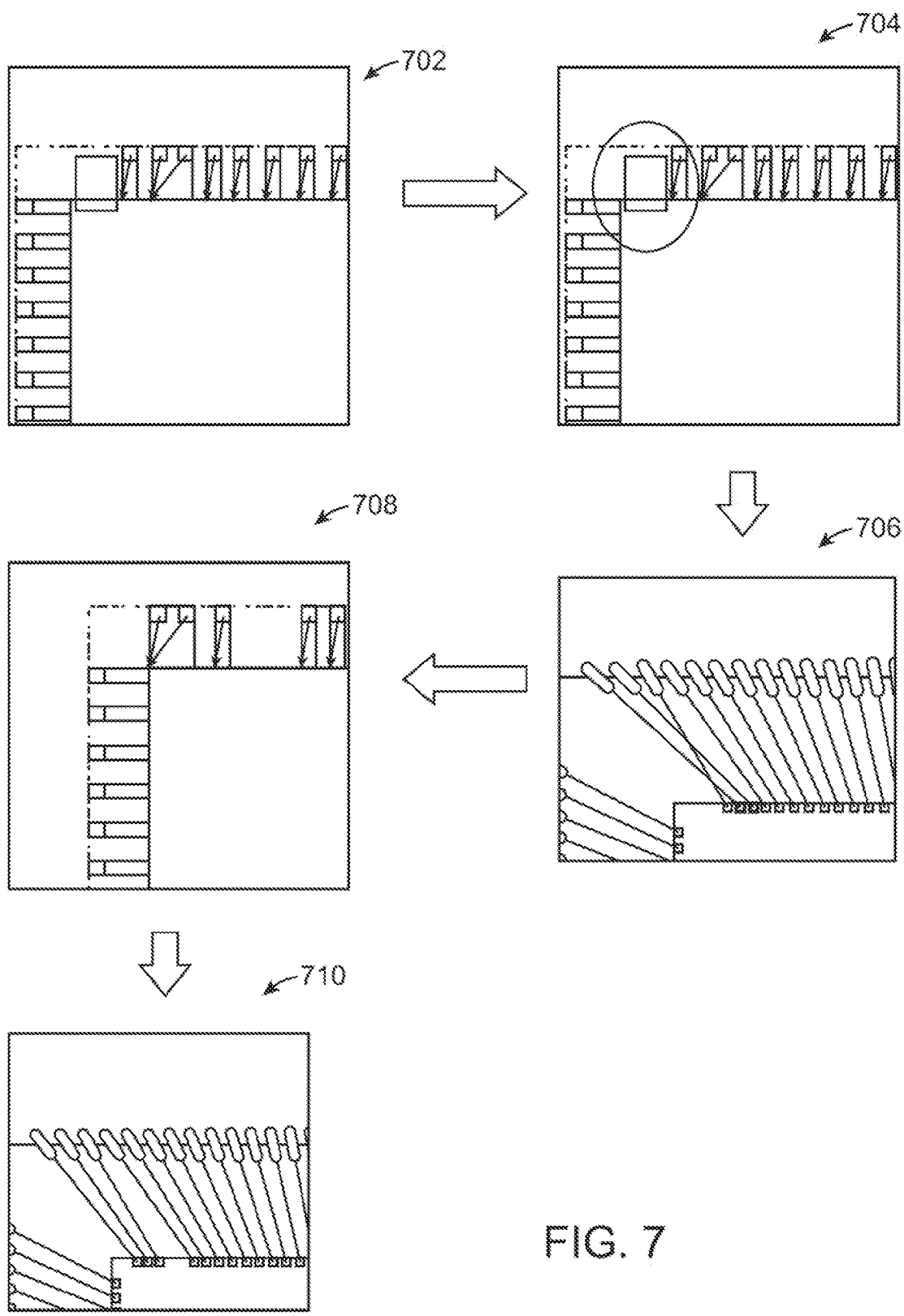
FIG. 7 illustrates an example of the operational flow of FIG. 4 in some embodiments.

Referring to FIG. 7 which illustrates an example of the operational flow of FIG. 4 in some embodiments. It shall be noted that FIG. 7 is presented here only for illustration and explanation purposes and does not intend to limit the scope of various embodiments to the SiP tool or the I/O planner described or shown here and does not intend to limit the scope of various embodiments to an IC packaging design as illustrated herein. One of ordinary skill in the art will clearly understand that although various illustrated embodiments as described in the specification use IC packaging design tool and IC physical implementation tool, the mentioning of these two tools is merely for illustration and explanation purposes and does not intend to limit the scope of various embodiments to these two types of EDA tools.

At 702, the method or the system initiates a command in the I/O planner to move pins in the SiP tool substantially simultaneously or substantially concurrently with pins in the I/O planner. At 704, the method or the system identifies an I/O cell in the I/O planner. As illustrated here in FIG. 7, the I/O cell is attached to the pointing device and may be moved to the new location. At 706, the method or the system contacts the SiP to communication the information of which pins are linked to the selected I/O cell in the I/O planner. At 708, the method or the system places the I/O cell at a new location in the I/O planner. As illustrated here in FIG. 7, the I/O cell is snapped to an I/O row and followed by the attached bond pads. At 710, the method or the system moves pins in the SiP tool to new location(s), followed by attached wire-bonds or routing.

System Architecture Overview

Figure 9:
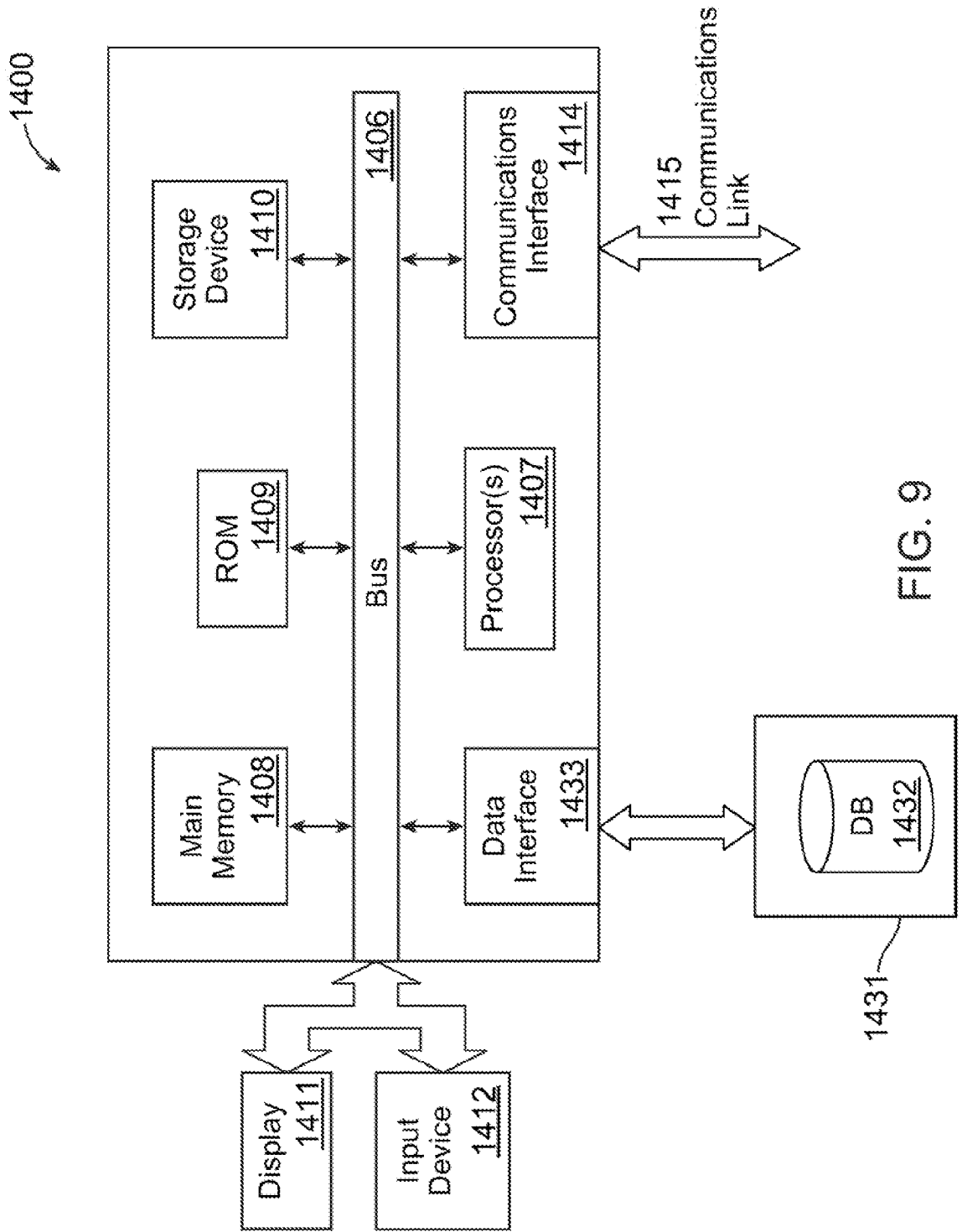
FIG. 9 illustrates a computerized system on which a method for parallelizing tasks in processing an electronic circuit design can be implemented.

FIG. 9 illustrates a block diagram of an illustrative computing system 1400 suitable for implementing various embodiments of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control (not shown).

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media, volatile media, and transmission media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution. Computer system 1400 may also interact with a database system 1432 via a data interface 1433 where the computer system 1400 may store and retrieve information or data of the electronic design into and from the database system.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The aforementioned embodiments are described for the ease of illustration and explanation but do not intend to and shall not be construed to limit the scope of various embodiments. Modification and substitution may also be made by one of ordinary skill in the art without departing from the spirit or scope of the invention, which should still be deemed to be within the scope as set forth by the claims. Other aspects and features of the invention will be evident from reading the following detailed description of the preferred embodiments, which are intended to illustrate, not limit, the invention. Although particular embodiments of the present inventions have been shown and described, it will be understood that it is not intended to limit the present inventions to the preferred embodiments, and it will be obvious to those skilled in the art that various changes and modifications may be made without departing from the spirit and scope of the present inventions. The specification and drawings are, accordingly, to be regarded in an illustrative rather than restrictive sense. Various embodiments are intended to cover alternatives, modifications, and equivalents, which may be included within the spirit and scope of the present inventions as defined by the claims.

We claim:

1. A machine-implemented method for implementing interactive cross-domain package driven I/O planning and placement optimization of an electronic circuit design, the method comprising:
    using at least one processor to perform a process, the process comprising:
    identifying a first object of the electronic circuit design on a first electronic design automation (EDA) tool session of a packaging design tool;
    determining or causing to determine a drop location in the first EDA tool session for the first object based at least in part upon a tentative location in the first EDA tool session, wherein the tentative location comprises a location that the first EDA tool session plans to place the first object in the electronic circuit design;
    placing the first object at the drop location in the first EDA tool session;
    adjusting or causing to adjust the drop location of the first object via a second EDA tool session of a physical electronic circuit design tool; and
    placing or routing a portion of the electronic circuit design in the first EDA tool session based at least in part upon a result of the act of adjusting or causing to adjust the drop location of the first object.

2. The machine-implemented method of claim 1, further comprising:
    identifying a second object on the second EDA tool session, wherein the second object is linked to or affected by the act of placing the first object.

3. The machine-implemented method of claim 2, further comprising:
    placing, causing to place, adjusting, or causing to adjust the second object in the first EDA tool session via the second EDA tool session.

4. The machine-implemented method of claim 1, wherein the tentative location in the first EDA tool session is determined by using a fuzzy logic or a mathematical formula via the second EDA tool session.

5. The machine-implemented method of claim 1, wherein the first EDA tool session and the second EDA tool session reside on a computing system.

6. The machine-implemented method of claim 1, wherein the first EDA tool session resides on a first computing system and the second EDA tool session resides on a second computing system.

7. The machine-implemented method of claim 1, further comprising:
    initiating the second EDA tool session object move in the first EDA tool session.

8. The machine-implemented method of claim 1, wherein the first EDA tool session comprises a computing session for an electronic packaging design tool.

9. The machine-implemented method of claim 1, wherein the first EDA tool session comprises a system in package (SiP) tool.

10. The machine-implemented method of claim 1, wherein the second EDA tool session comprises a computing session for an electronic circuit physical implementation tool.

11. The machine-implemented method of claim 1, wherein the second EDA tool session comprises an input/output (I/O) planning tool.

12. The machine-implemented method of claim 1, further comprising:
    determining whether a constraint is satisfied based at least in part upon the act of placing the first object at the drop location or the act of adjusting or causing to adjust the drop location or the act of placing or routing the portion of the electronic circuit design.

13. The machine-implemented method of claim 12, further comprising at least one of:
    determining whether or not the constraint may be relaxed;
    determining whether or not the constraint may be ignored;
    determining whether or not the constraint may be overridden; and
    determining whether or not the constraint falls within a don't-care space.

14. The machine-implemented method of claim 1, further comprising:
    determining whether or not a result of the act of adjusting or causing to adjust the drop location is legal.

15. The machine-implemented method of claim 1, further comprising:
    displaying or causing to display a ghost image of the first object at the tentative location.

16. The machine-implemented method of claim 1, further comprising:
    placing a corresponding first object in the second EDA tool session, wherein the corresponding first object and the first object represents an electronic circuit component design in the second EDA tool session and the first EDA tool session respectively.

17. The machine-implemented method of claim 1, further comprising:
concurrently editing the electronic circuit design.

18. The machine-implemented method of claim 1, further comprising:
initiating, spawning, or identifying one or more slaves on one or more computing systems for parallelizing one or more tasks on the first EDA tool session or the second EDA tool session.

19. The machine-implemented method of claim 18, further comprising:
initiating, spawning, or identifying a master for the act of parallelizing one or more tasks on the first EDA tool session or the second EDA tool session.

20. The machine-implemented method of claim 18, further comprising:
transmitting, identifying, or replicating a reduced representation of a portion of the electronic circuit design on at least one of the one or more slaves.

21. The machine-implemented method of claim 20, further comprising:
placing a corresponding first object in the first EDA tool session.

22. The machine-implemented method of claim 20, wherein the act of placing or routing the portion of the electronic circuit design comprising wire-bonding or packaging routing.

23. The machine-implemented method of claim 20, further comprising:
identifying a second object in the first EDA tool session, wherein the second object is linked to or affected by the act of placing the first object.

24. The machine-implemented method of claim 20, wherein the first EDA tool session comprises a system in package (SiP) tool.

25. The machine-implemented method of claim 20, wherein the second EDA tool session comprises a computing session for an electronic circuit physical implementation tool.

26. The machine-implemented method of claim 1, further comprising:
embedding decision logic in one or more databases for the first EDA tool session or the second EDA tool session.

27. The machine-implemented method of claim 26, further comprising:
modifying the decision logic in or adding additional decision logic to the one or more databases.

28. The machine-implemented method of claim 27, further comprising:
modifying one or more constraints or adding one or more additional constraints based at least in part upon the act of modifying the decision logic in or adding the additional decision logic to the one or more databases.

29. The machine-implemented method of claim 28, further comprising:
placing, causing to place, adjusting, or causing to adjust the second object in the second EDA tool session via the first EDA tool session.

30. The machine-implemented method of claim 1, further comprising:
initiating the first EDA tool session object move in the second EDA tool session.

31. The machine-implemented method of claim 1, further comprising:
determining whether a constraint is satisfied based at least in part upon the act of placing the first object at the drop location or the act of adjusting or causing to adjust the drop location or the act of placing or routing the portion of the electronic circuit design.

32. The machine-implemented method of claim 31, further comprising at least one of:
determining whether or not the constraint may be relaxed;
determining whether or not the constraint may be ignored;
determining whether or not the constraint may be overridden; and
determining whether or not the constraint falls within a don't-care space.

33. A system for implementing interactive cross-domain package driven I/O planning and placement optimization of an electronic circuit design, the system comprising:
a processor that is to:
identify a first object of the electronic circuit design on a first electronic design automation (EDA) tool session of a packaging design tool;
determine or cause to determine a drop location in the first EDA tool session for the first object based at least in part upon a tentative location in the first EDA tool session, wherein the tentative location comprises a location that the first EDA tool session plans to place the first object in the electronic circuit design;
place the first object at the drop location in the first EDA tool session;
adjust or cause to adjust the drop location of the first object via a second EDA tool session of a physical electronic circuit design tool; and
place or route a portion of the electronic circuit design in the first EDA tool session based at least in part upon a result of the act of adjusting or causing to adjust the drop location of the first object.

34. A computer program product comprising a non-transitory computer-usable storage medium having executable code to execute a process for parallelizing tasks in processing an electronic circuit design, the process comprising:
identifying a first object of the electronic circuit design on a first electronic design automation (EDA) tool session of a packaging design tool;
determining or causing to determine a drop location in the first EDA tool session for the first object via a second EDA tool session based at least in part upon a tentative location in the first EDA tool session, wherein the tentative location comprises a location that the first EDA tool session plans to place the first object in the electronic circuit design;
placing the first object at the drop location in the first EDA tool session;
adjusting or causing to adjust the drop location of the first object of an electronic circuit design tool; and
placing or routing a portion of the electronic circuit design in the first EDA tool session based at least in part upon a result of the act of adjusting or causing to adjust the drop location of the first object.

35. A machine-implemented method for implementing interactive cross-domain package driven I/O planning and placement optimization of an electronic circuit design, the method comprising:
using at least one process to perform a process, the process comprising:
identifying a first object of the electronic circuit design on a second electronic design automation (EDA) tool session of an electronic circuit design tool;
placing the first object at a drop location in the second EDA tool session based at least in part upon a tentative location for the first object in the second EDA tool session, wherein the tentative location comprises a location that the second EDA tool session plans to place the first object in the electronic circuit design;

adjusting or causing to adjust the drop location of the first object via a first EDA tool session of a packaging design tool; and placing or routing a portion of the electronic circuit design in the first EDA tool session based at least in part upon a result of the act of adjusting or causing to adjust the drop location of the first object.

36. The computer implemented method of claim 35, the process further comprising:

determining whether a constraint is satisfied based at least in part upon the act of placing the first object at the drop location or the act of adjusting or causing to adjust the drop location or the act of placing or routing the portion of the electronic circuit design.

37. The computer implemented method of claim 36, the process further comprising:

determining whether or not the constraint may be relaxed;
determining whether or not the constraint may be ignored;
determining whether or not the constraint may be overridden; and
determining whether or not the constraint falls within a don't-care space.

38. A system for implementing interactive cross-domain package driven I/O planning and placement optimization of an electronic circuit design, the system comprising:

a processor that is to:

identify a first object of the electronic circuit design on a second electronic design automation (EDA) tool session of an electronic circuit design tool;

place the first object at a drop location in the second EDA tool session based at least in part upon a tentative location for the first object in the second EDA tool session, wherein the tentative location comprises a location that the second EDA tool session plans to place the first object in the electronic circuit design;

adjust or cause to adjust the drop location of the first object via a first EDA tool session of a packaging design tool;

place a corresponding first object in the first EDA tool session; and place or route a portion of the electronic circuit design in the first EDA tool session based at least in part upon a result of the act of adjusting or causing to adjust the drop location of the first object.

39. The system of claim 38, wherein the processor is further to:

determine whether a constraint is satisfied based at least in part upon the act of placing the first object at the drop location or the act of adjusting or causing to adjust the drop location or the act of placing or routing the portion of the electronic circuit design.

40. The system of claim 39, wherein the processor is further to:

determine whether or not the constraint may be relaxed;
determine whether or not the constraint may be ignored;
determine whether or not the constraint may be overridden; and
determine whether or not the constraint falls within a don't-care space.

41. A computer program product comprising a non-transitory computer-usable storage medium having executable code to execute a process for implementing interactive cross-domain package driven I/O planning and placement optimization of an electronic circuit design, the process comprising:

identifying a first object of the electronic circuit design on a second electronic design automation (EDA) tool session of an electronic circuit design tool;

placing the first object at a drop location in the second EDA tool session based at least in part upon a tentative location for the first object in the second EDA tool session, wherein the tentative location comprises a location that the second EDA tool session plans to place the first object in the electronic circuit design;

adjusting or causing to adjust the drop location of the first object via a first EDA tool session of a packaging design tool;

placing a corresponding first object in the first EDA tool session; and placing or routing a portion of the electronic circuit design in the first EDA tool session based at least in part upon a result of the act of adjusting or causing to adjust the drop location of the first object.

42. The computer program product of claim 41, the process further comprising:

determining whether a constraint is satisfied based at least in part upon the act of placing the first object at the drop location or the act of adjusting or causing to adjust the drop location or the act of placing or routing the portion of the electronic circuit design.

43. The computer program product of claim of claim 42, the process further comprising:

determining whether or not the constraint may be relaxed;
determining whether or not the constraint may be ignored;
determining whether or not the constraint may be overridden; and
determining whether or not the constraint falls within a don't-care space.

* * * * *